(12) United States Patent
Huang

(10) Patent No.: US 11,757,057 B2
(45) Date of Patent: Sep. 12, 2023

(54) COLORED SOLAR MODULE

(71) Applicant: HELIARTEC SOLUTIONS CORPORATION, LTD., Zhubei (TW)

(72) Inventor: Ting-Hui Huang, Zhubei (TW)

(73) Assignee: HELIARTEC SOLUTIONS CORPORATION, LTD.

( * ) Notice: Subject to any disclaimer, the term of this patent is extended or adjusted under 35 U.S.C. 154(b) by 0 days.

(21) Appl. No.: 17/731,849

(22) Filed: Apr. 28, 2022

(65) Prior Publication Data
US 2023/0041537 A1  Feb. 9, 2023

(51) Int. Cl.
*H01L 31/048* (2014.01)
*H01L 31/054* (2014.01)
*H01L 31/18* (2006.01)

(52) U.S. Cl.
CPC ...... *H01L 31/0481* (2013.01); *H01L 31/0543* (2014.12); *H01L 31/0547* (2014.12); *H01L 31/18* (2013.01)

(58) Field of Classification Search
CPC . H01L 31/042; H01L 31/048; H01L 31/0481; H01L 31/0488; H01L 31/0543; H01L 31/0547; H01L 31/18
See application file for complete search history.

(56) References Cited

U.S. PATENT DOCUMENTS

2018/0239070 A1   8/2018  England et al.
2019/0088808 A1*  3/2019  Wittkopf ................. B32B 17/00

FOREIGN PATENT DOCUMENTS

| CA | 2752277 A1 * | 3/2012 | ....... H01L 31/02366 |
| CN | 112811828 A | 5/2021 | |
| CN | 112993069 A | 6/2021 | |
| KR | 102258304 B1 * | 5/2021 | |
| WO | WO2020155628 A1 | 6/2020 | |

OTHER PUBLICATIONS

Machine translation of KR-102258304-B1, Lee Jae Hyuk. (Year: 2021).*
Office Action issued by the Japan Patent Office dated Feb. 7, 2023.
English translation of the abstract for CN112811828A.
English translation of the abstract for CN112993069A.

* cited by examiner

*Primary Examiner* — Mayla Gonzalez Ramos
(74) *Attorney, Agent, or Firm* — BEHMKE INNOVATION GROUP LLC; James M. Behmke; Jonathon P. Western

(57) ABSTRACT

A colored solar module is provided, in which at least one solar cell is embedded in an encapsulation layer, and a transparent plate is disposed on the encapsulation layer. The transparent plate has a single coating layer containing quartz for attaching onto the encapsulation layer so as to reflect the desired color light.

7 Claims, 11 Drawing Sheets

COLORED SOLAR MODULE

CROSS-REFERENCE TO RELATED APPLICATION

This application claims the benefit of Taiwanese Patent Application No. 110128530, filed on Aug. 3, 2021, and Taiwanese Patent Application No. 111102620, filed on Jan. 21, 2022, the entire contents of which are incorporated herein.

BACKGROUND

1. Technical Field

The present disclosure relates to a solar module. The present disclosure further relates to a colored solar module for Building Integrated Photovoltaic (BiPV).

2. Description of Related Art

As the global warming becomes more and more serious, countries all over the world are paying more and more attention to the environmental protection awareness of energy saving and carbon reduction. Therefore, reducing energy consumption is the first priority. At present, the energy consumption of buildings accounts for more than 40% of the total energy consumption. Therefore, regarding how to slow down the speed of climate change and global warming, it is important to reduce the energy consumption of buildings.

Faced with the problem of energy consumption of buildings, many advanced countries have proposed policy goals such as near Zero Energy Building (nZEB) or Zero Energy Building (ZEB). Among them, the application of Building Integrated Photovoltaic (BiPV) is an important method to achieve the goal of nZEB.

However, high-rise buildings (such as buildings with four or more floors) have higher energy requirements, which cannot achieve the goal of near zero energy or zero energy only by installing solar panels on the limited area of the roof. Therefore, the walls of such buildings need to be integrated to form solar walls to make up for the aforementioned energy demand. In addition, Color Building Integrated Photovoltaic (Color BiPV) not only achieves the goal of nZEB but also make up for the aesthetics that conventional solar energy cannot provide for exterior walls of buildings.

In order to enable solar panels to have the effect of beautifying the buildings when they are integrated with the exterior walls of buildings, the solution is to make the solar panels have colorful patterns to form Color BiPV, thereby achieving the goal of nZEB, which can make up for the lack of aesthetics that conventional solar panels cannot provide for exterior walls of buildings.

At present, coloring technologies commonly used in color solar modules can be classified into cell coloring, cover glass (inside or outside) coloring with colored pigments or glazes, encapsulating material (polyvinyl butyral [PVB] or ethylene-vinyl acetate copolymer [EVA]) coloring, and deposition of optical interference multi-layer film on cover glass (inside) for achieving coloring effect.

However, Color BiPV is currently facing a bottleneck that cannot balance aesthetics, manufacturing cost, and photoelectric conversion rate, such that Color BiPV cannot be popularized. For example, the existing mass production technology for the coloring of color solar modules has the following problems:

Conventional technology one: solar cell coloring, which is mainly used in polycrystalline silicon solar cells, such as the patent TWI409962, EP2154727A2 or US2010037948A1, etc. Traditional solar module manufacturing process is adopted to simplify manufacture and reduce production cost. However, this technology can only be used for the specifications of polycrystalline silicon solar cells. Its power generation efficiency is lower than that of monocrystalline silicon solar cells, and the color variation is limited. As a result, the manufactured solar module is limited to a grid-like layout and thus unable to meet aesthetic requirements.

Conventional technology two: using colored glass as the front cover of a colored solar module, which is easy to manufacture, so that the production cost is extremely low, but colored glass still has the problem of insufficient structural strength after strengthening, and the transmittance of colored glass is low, resulting in poor photoelectric conversion rate and poor aesthetics.

Conventional technology three: coloring the encapsulating material of solar modules, such as coloring on EVA or PVB material, in order to achieve the purpose of coloring. It adopts the mature technology of the construction industry of combining coloring glue and glass, so the solar modules are easy to manufacture and the production cost is extremely low, but the transmittance of the colored encapsulating material is low, resulting in extremely low photoelectric conversion rate and poor aesthetics.

Conventional technology four: coating glaze or pigment on the outside or inside of the front cover (glass) of a solar module, such as the patent TWI631718, which has high color variation selectivity and can be configured with various patterns to improve aesthetics. However, when the density of the color layer or the color spots formed by the glaze is high, in addition to reflecting the light of the wavelength composed of the color of the color layer or the color spots, the color layer or the color spots also blocks the light of other wavelengths from entering the solar module, which affects the conversion rate of the solar module.

Conventional technology five: multi-layer interference is used to produce color light reflection, which uses plasma sputtering technology to deposit metal oxide film or thin metal film on glass to form an optical interference effect and reflect color light, in order to achieve the effect of solar module coloring, such as the patent LT2897795 T or CN104736338B. Only specific color light is reflected out of the solar module to achieve the coloring effect, and the rest of the incident light is still absorbed by the solar cells in the solar module, so the conversion rate is higher than the aforementioned conventional technologies one to four. However, in this method, a large-scale vacuum sputtering machine is required for the multi-layer film deposition process, resulting in equipment cost and manufacturing cost much higher than those of the aforementioned conventional technologies one to four. Moreover, a single solar module can only have a single color, and patterns cannot be designed on the solar module, which leads to severe restrictions on aesthetics.

In view of above, none of the five aforementioned conventional production technologies for color solar modules and other current Color BiPVs can simultaneously meet the requirements of aesthetics, high photoelectric conversion rate, and low manufacturing cost, etc.

Therefore, how to provide a solar module technology that meets the requirements of aesthetics, high photoelectric conversion rate, and low manufacturing cost has become an urgent problem to be solved at present.

SUMMARY

In view of the above problems of the prior art, the present disclosure provides a colored solar module, which includes: an encapsulation layer having a first surface and a second surface opposite to each other; at least one solar cell embedded in the encapsulation layer; and a transparent plate having a single coating layer containing quartz, wherein the transparent plate is attached onto the first surface of the encapsulation layer via the coating layer.

In the aforementioned colored solar module, the coating layer further contains an impurity that is composed of one or more of oxides, carbonates, borates and silicates of elements of an alkali family, an alkaline earth group and a boron group.

In the aforementioned colored solar module, the coating layer has a thickness of 0.1 microns to 50 microns.

In the aforementioned colored solar module, the coating layer has a refractive index greater than a refractive index of the transparent plate and greater than a refractive index of the encapsulation layer.

In the aforementioned colored solar module, the coating layer has a refractive index lesser than a refractive index of the transparent plate and lesser than a refractive index of the encapsulation layer.

In the aforementioned colored solar module, the transparent plate has a refractive index greater than a refractive index of the encapsulation layer formed between the transparent plate and the at least one solar cell.

In the aforementioned colored solar module, the coating layer is a structure with a single uniform thickness or a structure with different regional thicknesses.

In the aforementioned colored solar module, the at least one solar cell is a crystalline silicon solar cell or a thin-film solar cell.

In the aforementioned colored solar module, the present disclosure further comprises a cover plate disposed on the second surface of the encapsulation layer.

In the aforementioned colored solar module, the coating layer is intrinsically colorless and transparent.

In summary, the colored solar module of the present disclosure generates the effect of different colors or patterns mainly through a single coating layer of the transparent plate that contains quartz so that the incident light generates destructive interference effect to reflect the corresponding color light. Therefore, compared to the prior art, when the present disclosure is applied to Color BiPV, it can meet the requirements of aesthetics, high photoelectric conversion rate and low manufacturing cost at the same time.

BRIEF DESCRIPTION OF THE DRAWINGS

FIG. 1A-2 is a schematic cross-sectional side view of a colored solar module according to a second embodiment of the present disclosure.

FIG. 1A-3 is a schematic cross-sectional side view of a colored solar module according to a third embodiment of the present disclosure.

FIG. 1A-4 is a schematic cross-sectional side view of a colored solar module according to a fourth embodiment of the present disclosure.

FIGS. 1B-1 to 1E are schematic views illustrating a manufacturing method of a colored solar module according to the first embodiment of the present disclosure.

FIG. 1B-2 is a schematic view showing another aspect of FIG. 1B-1.

FIG. 2 is a schematic view of the refraction of the transparent front cover, the quartz coating layer and the encapsulation layer in a colored solar module of the present disclosure.

DETAILED DESCRIPTION OF THE EMBODIMENTS

The following examples are used for illustrating the present disclosure. A person skilled in the art can easily conceive the other advantages and effects of the present disclosure, based on the disclosure of the specification. The present disclosure can also be implemented or applied as described in different examples. It is possible to modify or alter the following examples for carrying out this disclosure without contravening its spirit and scope, for different aspects and applications.

Figures 1, 1A:
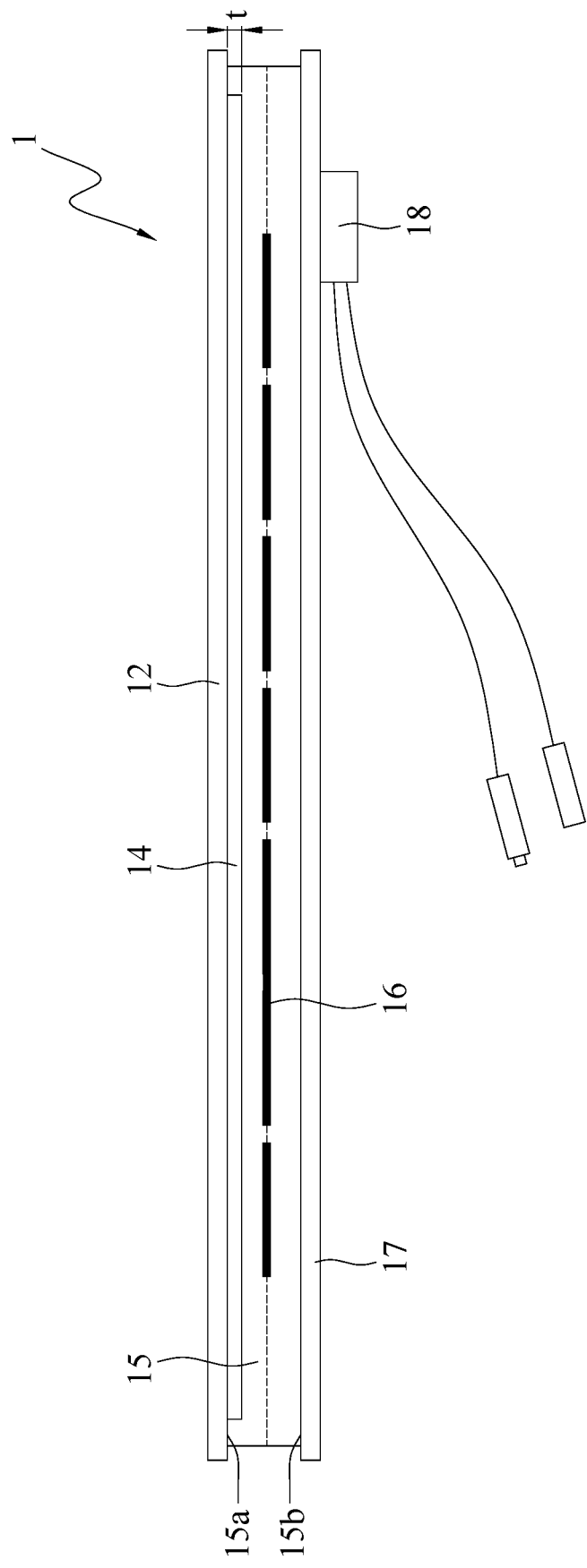
FIG. 1A-1 is a schematic cross-sectional side view of a colored solar module according to a first embodiment of the present disclosure.

FIG. 1A-1 is a schematic cross-sectional side view of a colored solar module 1 according to a first embodiment of the present disclosure. As shown in FIG. 1A-1, the colored solar module 1 is in the form of a crystalline silicon double glass, which includes an encapsulation layer 15, at least one solar cell 16 embedded in the encapsulation layer 15 (a plurality of solar cells 16 connected in series with each other is taken as an example hereinafter), and a transparent plate 12 attached on the encapsulation layer 15, and the transparent plate 12 is formed with a coating layer 14, and the transparent plate 12 is attached to the encapsulation layer 15 via the coating layer 14.

The encapsulation layer 15 is an encapsulation film, which has a first surface 15a and a second surface 15b opposite to each other, and a cover plate 17 is disposed on the second surface 15b, and a junction box 18 is disposed on the cover plate 17. The junction box 18 is electrically connected to the solar cells 16 for supplying electric power to the solar cells 16.

In an embodiment, the encapsulation layer 15 can be made of ethylene-vinyl acetate copolymer (EVA) or polyvinyl butyral (PVB), and the cover plate 17 is a transparent glass plate that can strengthen the supporting effect of the colored solar module 1.

Each solar cell 16 has a surface facing toward the sun and another surface facing away from the sun opposite to each other, so that the surface facing toward the sun faces the first surface 15a of the encapsulation layer 15.

The transparent plate 12 contains a glass material, which serves as a front plate or a laminated plate, and the coating layer 14 is formed on its inner surface, that is, on the glass surface in contact with the encapsulation layer 15.

The coating layer 14 contains quartz and covers the first surface 15a of the encapsulation layer 15.

In an embodiment, the coating layer 14 is made by mixing impurities of the alkali family, the alkaline earth group, the boron group, or two or three of the foregoing, and quartz, so that the coating layer 14 becomes an impurity-mixed intrinsically colorless single layer quartz coating structure with a thickness t of 0.1 microns to 50 microns. The refractive index of the coating layer 14 is greater than the refractive index of the transparent plate 12 (the refractive index of glass is 1.55 or the refractive index of solar ultra-clear glass is about 1.51 to 1.52) and greater than the refractive index of the encapsulation layer 15 (the refractive index of EVA is about 1.49-1.50 or the refractive index of PVB is about 1.48 to 1.49). Alternatively, the refractive index of the coating layer 14 is lesser than the refractive index of the transparent plate 12 and lesser than the refractive index of the encapsulation layer 15. The refractive index of the transparent plate 12 is greater than that of the part of the encapsulation layer 15 between the transparent plate 12 and the at least one solar cell 16 (the part between the dotted line and the first surface 15a as shown in FIG. 1A-1).

Figures 1, 1A, 2:
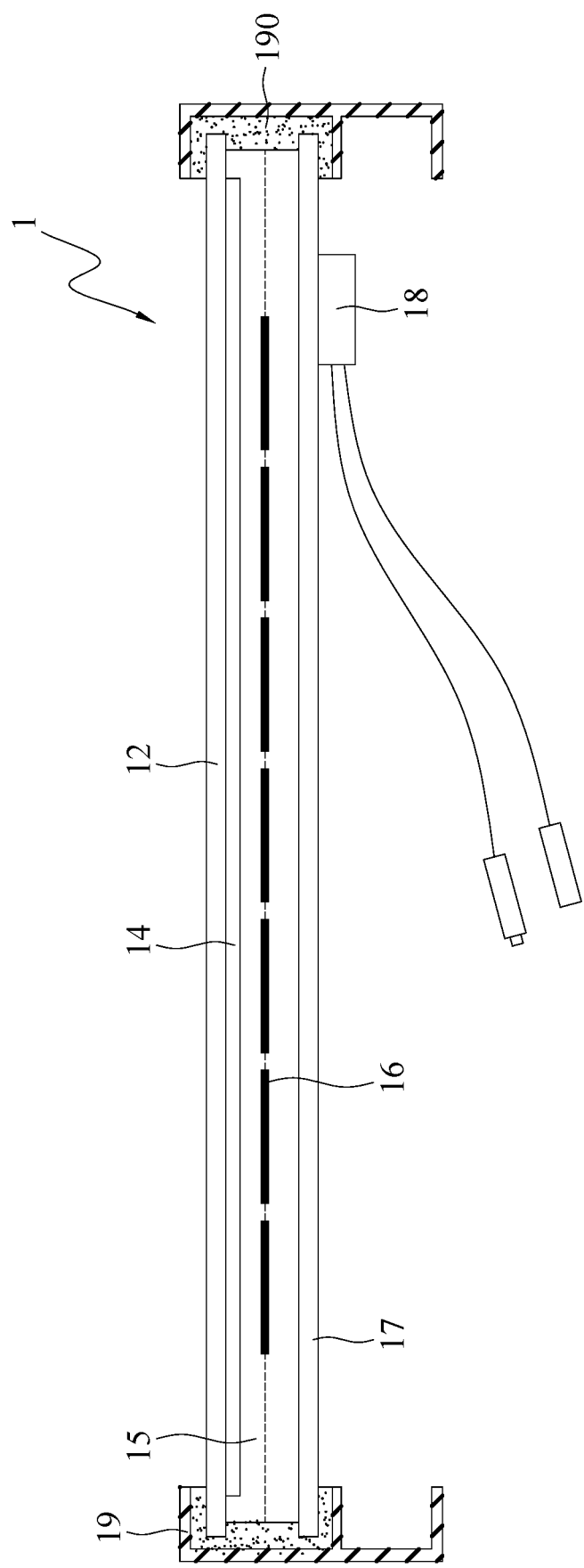
Figures 1, 1A, 2, 3:
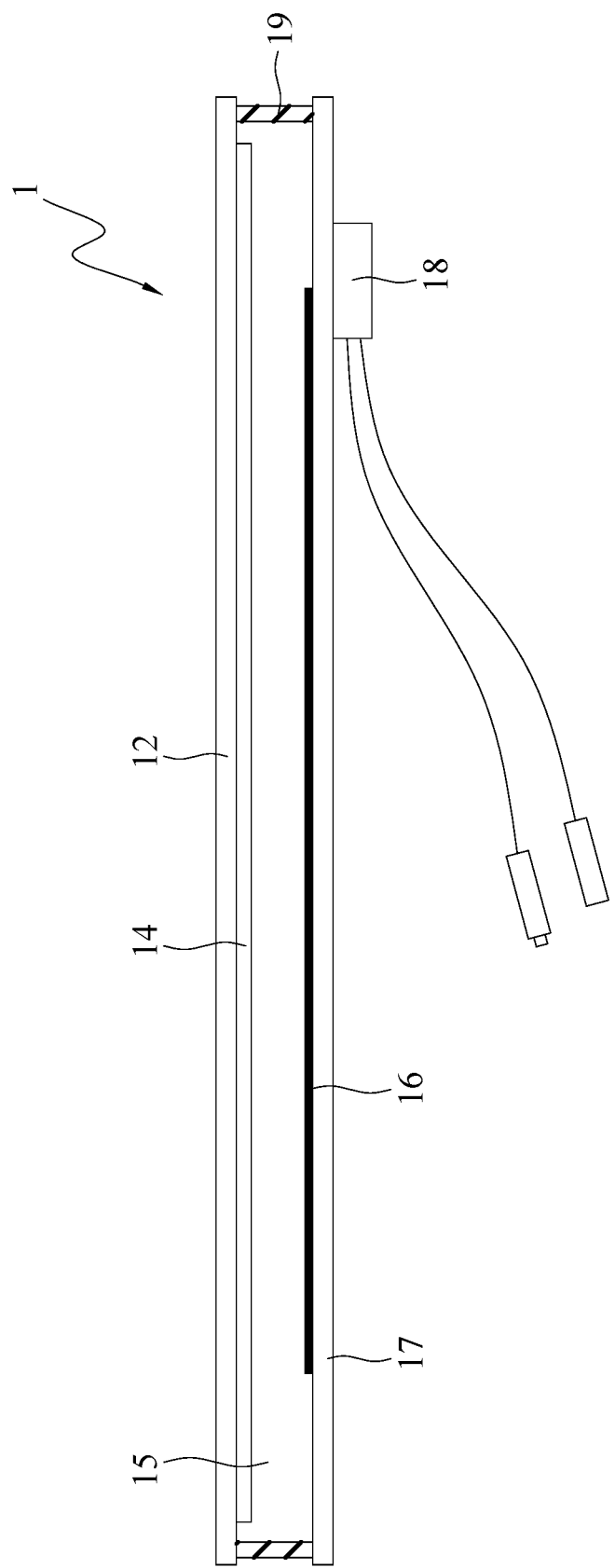
Figures 1, 1A, 2, 3, 4:
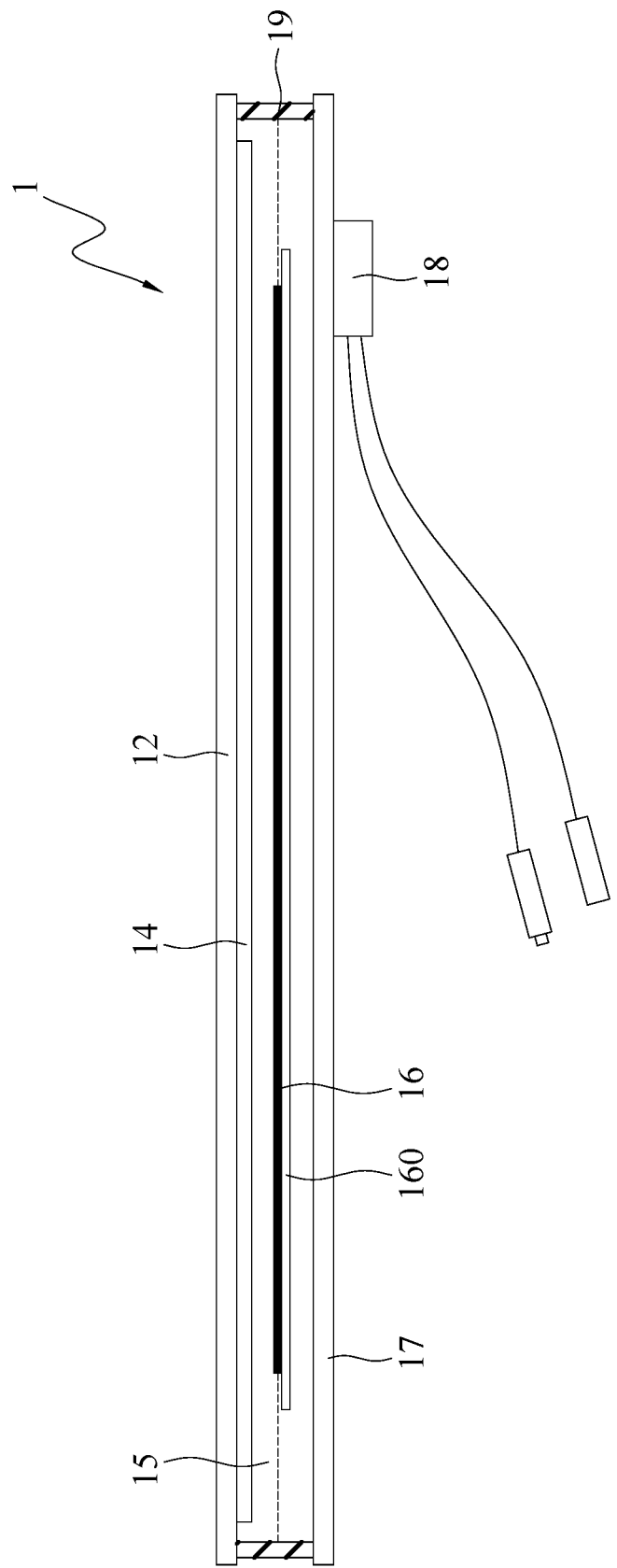

FIG. 1A-2 is a schematic cross-sectional side view of the colored solar module 1 according to a second embodiment of the present disclosure. The difference between this embodiment and the first embodiment lies in the form of the solar module, so the same features will not be repeated in the following.

As shown in FIG. 1A-2, the colored solar module 1 is in the form of a crystalline silicon glass/back-sheet, and its cover plate 17 is a back sheet, so an aluminum frame 19 can be configured for supporting the transparent plate 12, the encapsulation layer 15 and the cover plate 17. The aluminum frame 19 is attached to the transparent plate 12, the encapsulation layer 15 and the cover plate 17 by an adhesive 190.

FIG. 1A-3 is a schematic cross-sectional side view of the colored solar module 1 according to a third embodiment of the present disclosure. The difference between this embodiment and the second embodiment lies in the form of the solar module, so the same features will not be repeated in the following.

As shown in FIG. 1A-3, the colored solar module 1 is in the form of standard thin film double, and the solar cell 16 is in the form of a thin film attached on the cover plate 17 in the form of a glass substrate, and the frame 19 is erected between the transparent plate 12 and the cover plate 17.

FIG. 1A-4 is a schematic cross-sectional side view of the colored solar module 1 according to a fourth embodiment of the present disclosure. The difference between this embodiment and the third embodiment lies in the form of the solar module, so the same features will not be repeated in the following.

As shown in FIG. 1A-4, the colored solar module 1 is in the form of a fully embedded thin film, and the solar cell 16 is in the form of a thin film, and the solar cell 16 is attached onto a substrate 160 embedded in the encapsulation layer 15. The cover plate 17 is a transparent glass plate.

Figures 1, 1B:
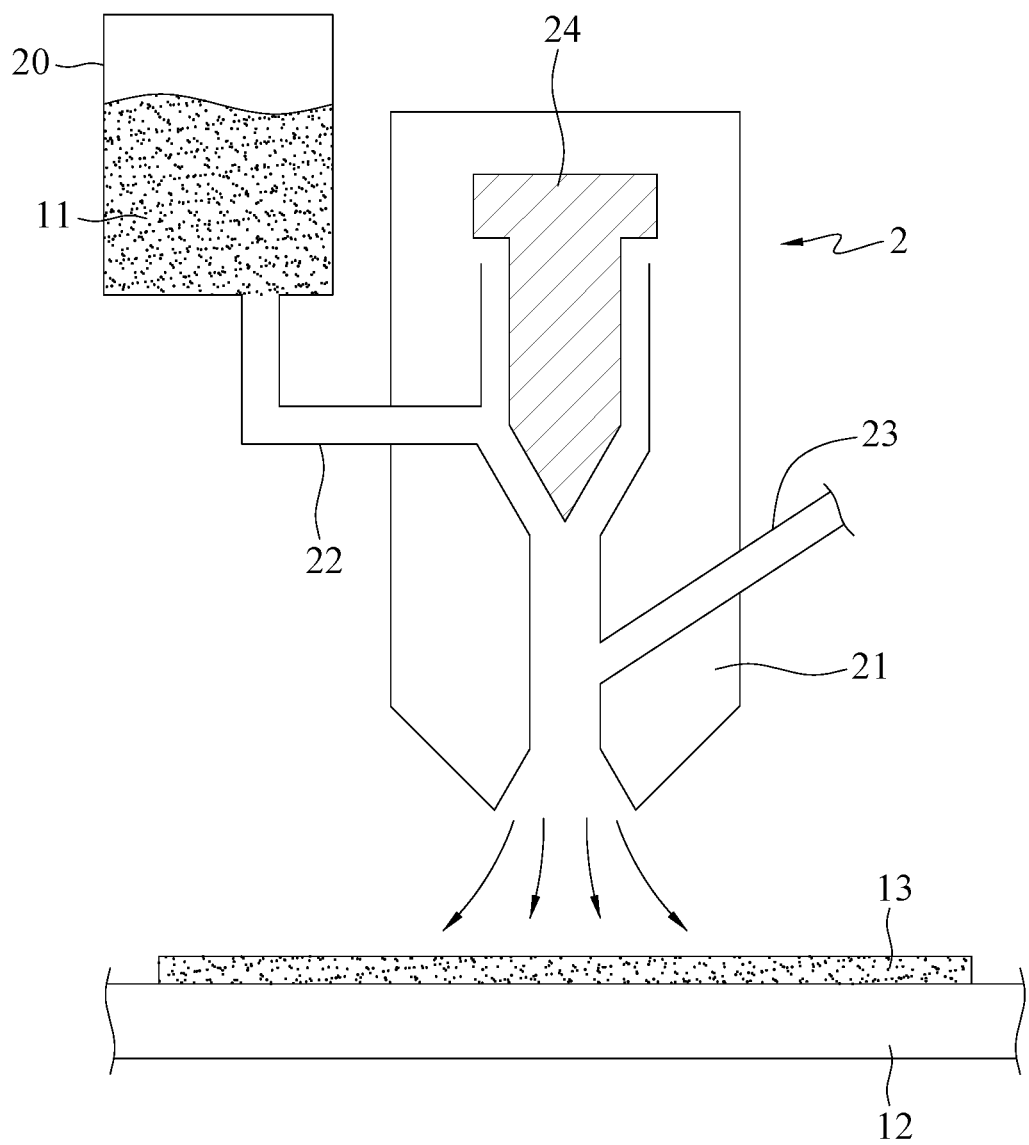
Figures 1, 1B, 2:
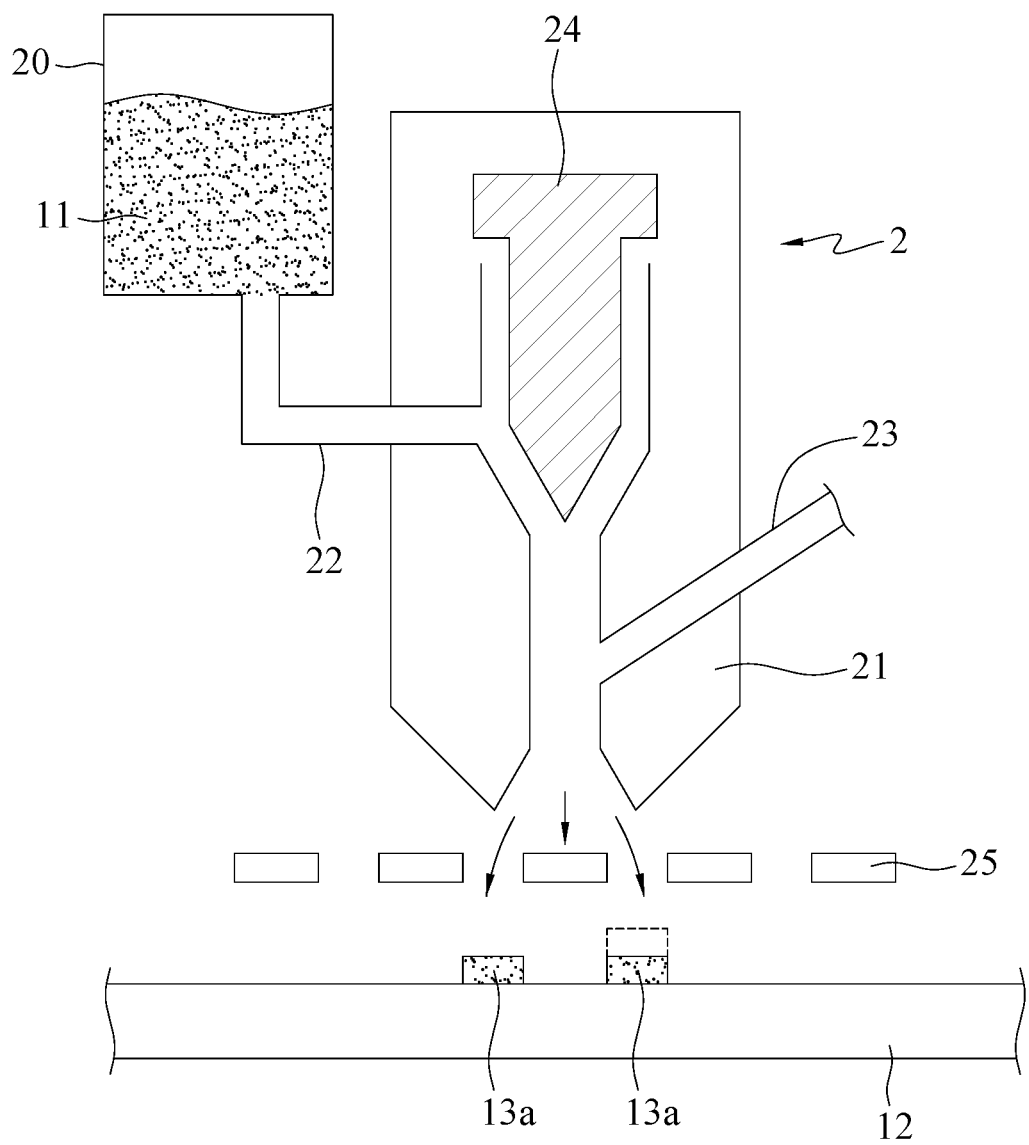
Figure 1C:
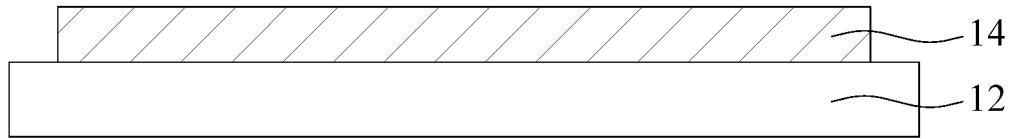
Figure 1D:
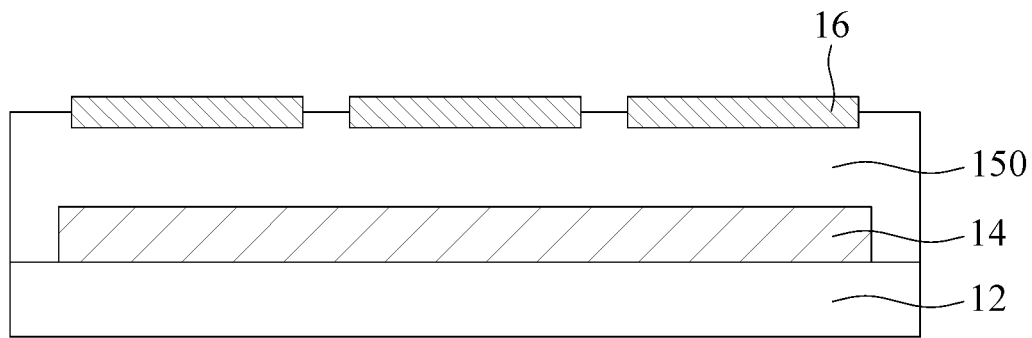
Figure 1E:
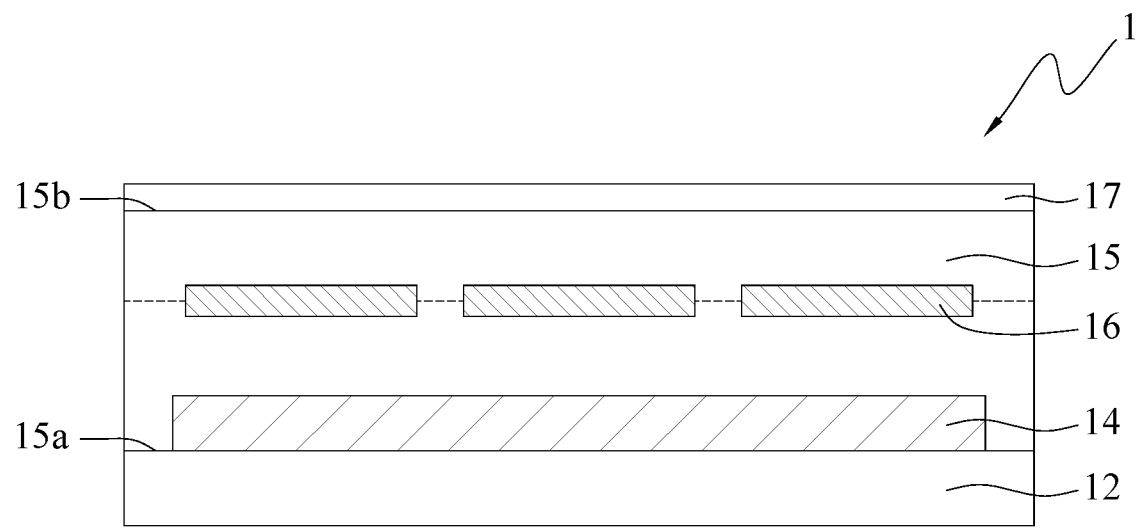
Figure 2:
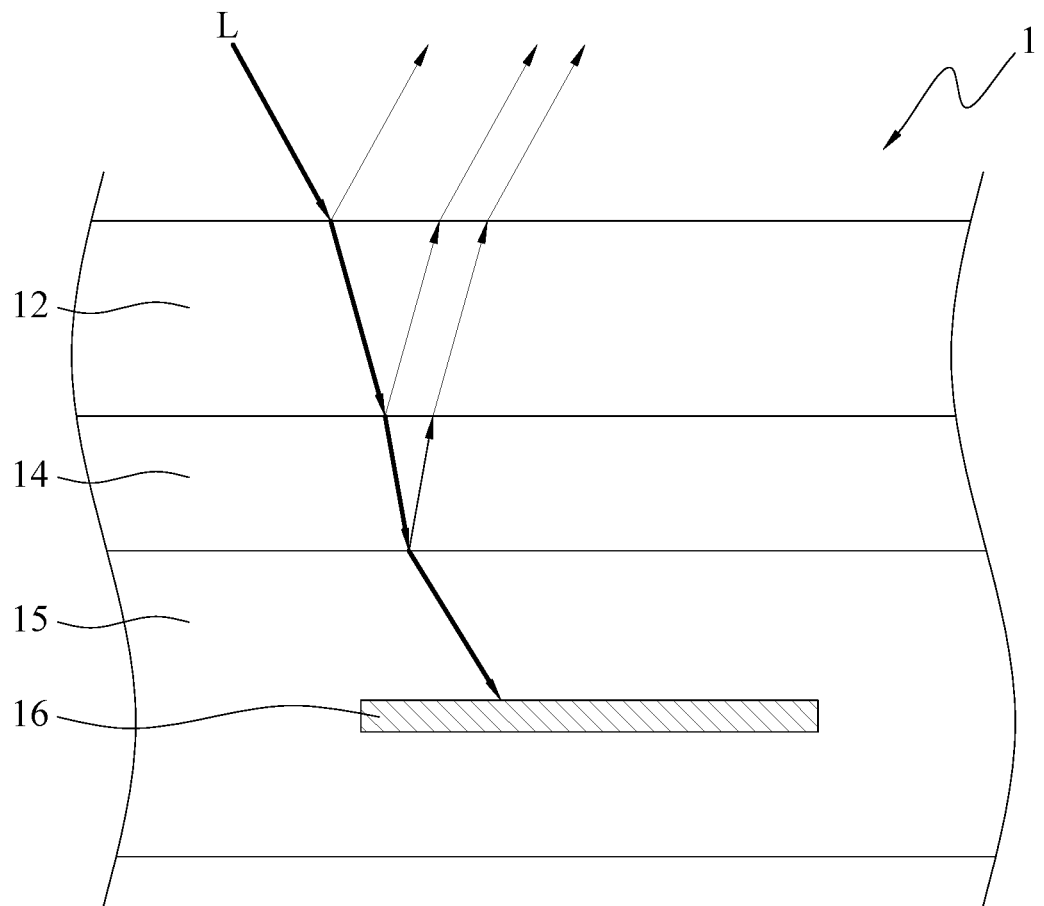

FIGS. 1B-1 to 1E are schematic views illustrating the manufacturing method of a colored solar module according to the first embodiment of the present disclosure.

First, grind quartz and at least one kind of impurity compound that is colorless or white in nature into powder and then mix them evenly, wherein the particle sizes of at least 85% of the particles in the powder are not larger than 1 micron (usually between 0.1 micron and 1 micron). Among them, white mineral powder would slightly reduce the transparency of the coating layer 14, but would not form coloring, thus making the coating layer 14 appear intrinsically colorless and transparent. The types of impurity compounds commonly used with quartz are shown in Table 1.

TABLE 1

| | | Name | Chemical Formula | Refractive Index | Melting Point (° C.) | Powder Color |
|---|---|---|---|---|---|---|
| | | Quartz | $SiO_2$ | ~1.4585 | 1650 | Transparent and Colorless |
| Alkali Family (CAS IA) | Oxide | Lithium Oxide | $LiO_2$ | 1.64 | 1567 | White |
| | | Sodium Oxide | $Na_2O$ | >1.6 | 1132 | White |
| | | Potassium Oxide | $K_2O$ | >1.6 | >490 | White |
| | Carbonate | Lithium Carbonate | $Li_2CO_3$ | ~1.428 | 723 | Colorless or White |
| | | Sodium Carbonate | $Na_2CO_3$ | ~1.535 | 851 | White |
| | | Potassium Carbonate | $K_2CO_3$ | ~1.421 | 891 | Colorless or White |
| | Aluminosilicate | Petalite | $Li_2O \cdot Al_2O_3 \cdot 4SiO_2$ | ~1.50-1.52 | 1200 | White |
| | | Albite | $Na_2O \cdot Al_2O_3 \cdot 6SiO_2$ | ~1.52-1.54 | 1100 | Colorless or White |
| | | Feldsper | $K_2O \cdot Al_2O_3 \cdot 6SiO_2$ | ~1.52-1.54 | 1200 | White |
| Alkaline Earth Group (CAS IIA) | Oxide | Magnesium Oxide | $MgO$ | ~1.72 | 2800 | White |
| | | Calcium Oxide | $CaO$ | ~1.83 | 2572 | White |
| | | Strontium Oxide | $SrO$ | ~1.81 | 2531 | White |
| | | Barium Oxide | $BaO$ | ~1.98 | 1923 | White |
| | Carbonate | Magnesium Carbonate | $MgCO_3$ | ~1.717 | 350 | White |
| | | Calcium Carbonate | $CaCO_3$ | ~1.49 | 1339 | White |
| | | Dolomite | $CaCO_3 \cdot MgCO_3$ | ~1.679-1.681 | 2800 | White |
| | | Strontium Carbonide | $SrCO_3$ | ~1.518 | 1290 | White |
| | | Barium Carbonate | $BaCO_3$ | ~1.63-1.65 | 811 | White |
| | Aluminosilicate | Labradorite | $CaO \cdot Al_2O_3 \cdot 2SiO_2$ | ~1.573-1.577 | 1550 | White |
| Boron Group (CAS IIIA) | Oxide | Boron Oxide | $B_2O_3$ | ~1.485 | 450 | White |
| | | Borax | $Na_2 \cdot 2B_2O_3 \cdot 10H_2O$ | >1.44 | 743 | White |

The component of the quartz is silicon dioxide, whose main function in the coating layer 14 is to support and fix the other impurity compound materials. After being melted and cooled, the quartz is attached and adhered to the glass surface.

The type of the doped impurity compound may be the alkali family, the alkaline earth group, the boron group or the aforementioned material of the alkali family, the alkaline earth group, and the boron group mixed in proportion.

The alkali family (CAS IA) oxide or carbonate is used as a flux for the quartz powder to greatly reduce the melting point of the quartz powder.

The alkaline earth group (CAS IIA) oxide or carbonate has a function to greatly increase the refractive index of the coating layer 14, wherein the oxides and carbonates of calcium, strontium and barium also have the effect of stabilizing the coating layer 14 to strengthen the coating layer 14.

The function of the aluminosilicates of the alkali family (CAS IA) and the alkaline earth group (CAS IIA) is to effectively increase the refractive index of the coating layer 14.

The boron oxide and the borax can not only be used as flux that greatly reduces the melting point of quartz, but also have the effect of stabilizing and strengthening the coating layer 14.

It is understandable that the quartz powder and the above-mentioned compound powder impurities can be mixed evenly in an appropriate ratio according to the required refractive index and the required melting point of the coating layer 14. Therefore, there is no limitation to the mixing of the quartz and impurities of the coating layer 14.

Next, the quartz powder after mixing with the impurities is made into a liquid coating material 11, as shown in FIG. 1B-1.

In an embodiment, when mixing the quartz powder that is previously mixed with the impurities with solvents, two solvents can be used, such as an aqueous ethanol solution of less than 40% of ethanol by weight, or a solvent of DEF (N,N-diethylformamide, $C_5H_{11}NO$) with polarity. For example, the quartz powder after mixing with the impurities and the aqueous ethanol solution are evenly mixed, and the weight percentage of the ethanol solvent does not exceed 40%, and the weight percentage of solid contents in the solution is controlled to be equal to or less than 35%.

Next, as shown in FIG. 1B-1, the coating material 11 is put into a storage tank 20, and then the coating material 11 is coated on the surface of the transparent plate 12 to form a surface fluid 13.

In an embodiment, the coating method of the coating material 11 is spraying the coating material 11 on the surface of the transparent plate 12 by using the ultrasonic high-pressure equipment 2. For example, the ultrasonic high-pressure equipment 2 includes an ultrasonic high-pressure nozzle 21, a channel 22 connecting the storage tank 20 and the ultrasonic high-pressure nozzle 21, a gas inlet 23 connected to the ultrasonic high-pressure nozzle 21, and an ultrasonic needle valve 24 configured corresponding to the ultrasonic high-pressure nozzle 21.

In use, the ultrasonic high-pressure equipment 2 is controlled to introduce the coating material 11 via the channel 22, and use the gas inlet 23 to introduce a nitrogen high-pressure auxiliary gas, and then control the ultrasonic needle valve 24 to send the coating material 11 into the ultrasonic high-pressure nozzle 21 to evenly spray the coating material 11 on the surface of the transparent plate 12 to form a surface fluid 13 through the ultrasonic high-pressure nozzle 21. After that, the surface fluid 13 is dried at a temperature of 120° C., and then sent into a tempering oven, where it is heated at a temperature not higher than 680° C., and the temperature is lower than the softening temperature of solar ultra-clear glass (approximately 710° C., while the softening temperature of typical architectural glass is approximately between 650° C. and 700° C., wherein the actual temperature required should be determined by the softening point of the glass used). As shown in FIG. 1C, after the quartz powder is fully melted, it is removed from the tempering oven, and then cooled with a cool air jet, so that the surface fluid 13 is cooled and hardened into the coating layer 14 attached onto the glass surface. Therefore, the coating material 11 can be baked together with the transparent plate 12 during the manufacturing process without causing the problem of melting of the transparent plate 12.

Further, in another embodiment, the ultrasonic high-pressure equipment 2 can also be applied to solar modules with patterns. As shown in FIG. 1B-2, before spraying the coating material 11, a patterned spraying mask 25 is disposed over the transparent plate 12, so that after spraying the coating material 11, a patterned surface fluid 13a corresponding to the spraying mask 25 is formed on the surface of the transparent plate 12, so that the subsequently formed coating layer has a pattern-like and partially spray-like appearance. In addition, the coating material 11 can be sprayed multiple times to make the coating layer have different thicknesses and/or different colors on different areas so as to present a three-dimensional (3D) pattern, as shown by the dashed line in FIG. 1B-2, in order to improve the aesthetics of the colored solar module.

As shown in FIG. 1D, an encapsulation material 150 (that is, the part of the encapsulation layer 15 between the dotted line shown in FIG. 1A-1 and the first surface 15a) is formed on the transparent plate 12 to cover the coating layer 14. Next, a plurality of solar cells 16 are embedded in the encapsulation material 150.

As shown in FIG. 1E, another encapsulation material is pressed onto the encapsulation material of the transparent plate 12 by the cover plate 17 to form the encapsulation layer 15. After that, provide the junction box to obtain the colored solar module 1.

Therefore, the colored solar module 1 of the present disclosure can generate the desired light refraction path via the design of the coating layer 14. As shown in FIG. 2, before sunlight enters the transparent plate 12 and reaches the solar cell 16, the incident path of the incident light L sequentially passes through the transparent plate 12, the coating layer 14 and the encapsulation layer 15. When the refractive index of the coating layer 14 is greater than the refractive index of the transparent plate 12 and greater than the refractive index of the encapsulation layer 15, the incident light L enters an optically denser medium (the coating layer 14) from an optically thinner medium (the transparent plate 12), and then enters another optically thinner medium (the encapsulation layer 15) from the optically denser medium (the coating layer 14). Alternatively, when the refractive index of the coating layer 14 is lesser than the refractive index of the transparent plate 12 and lesser than the refractive index of the encapsulation layer 15, the incident light L enters an optically thinner medium (the coating layer 14) from an optically denser medium (the transparent plate 12), and then enters another optically denser medium (the encapsulation layer 15) from the optically thinner medium (the coating layer 14). If the refractive index and the thickness of the quartz coating layer 14 of the optically denser medium are $n_q$ and t, respectively, and λ represents the color light wavelength of the incident light, when the optical interference condition of $2n_q t = (i+1/2)\lambda$ is met (wherein i is a positive integer, such as 1, 2, 3, . . . ), the incident light L induces destructive interference effect, such that the color light wavelength λ in the incident light L is reflected out of the transparent plate 12 of the colored solar module 1, so that the colored solar module 1 presents the color of the reflected color light, so as to achieve the coloring effect.

Take green light with a wavelength of 532 nm as an example for forming a colored solar module 1 with a green appearance. The refractive index of the coating layer 14 is adjusted to 1.65 after impurity doping, and the integer i is 20. The thickness t of the coating layer 14 is about 3.31 microns.

Based on the above settings, the appearance of the colored solar module 1 under the sun would be green. Alternatively, the refractive index of the coating layer 14 is adjusted to 1.46 after impurity doping, that is, the refractive index of the coating layer 14 is lesser than the refractive index of the transparent plate 12 (1.51 to 1.55) and lesser than the refractive index of the encapsulation layer 15 (1.48 to 1.50). The integer i is 20, and the thickness t of the coating layer 14 is about 4.63 microns. When the colored solar module 1 is under the sun, the transparent plate 12 would reflect light with a wavelength of 660 nm, thus making the appearance of the colored solar module 1 appear red.

Therefore, although the coating layer 14 made of quartz material mixed with impurities is intrinsically colorless, when the thickness t of the coating layer 14 is adjusted to an integral multiple plus one half of the color light wavelength λ, the transparent plate 12 of the colored solar module 1 exhibits the coloring effect by reflecting the color light due to destructive interference effect. Therefore, through controlling the refractive index of the single-layer and quartz-containing coating layer 14 and forming the corresponding thicknesses t of the coating layer 14 in different areas, the effect of emitting different colors or forming patterns can be achieved.

Figure 3A:
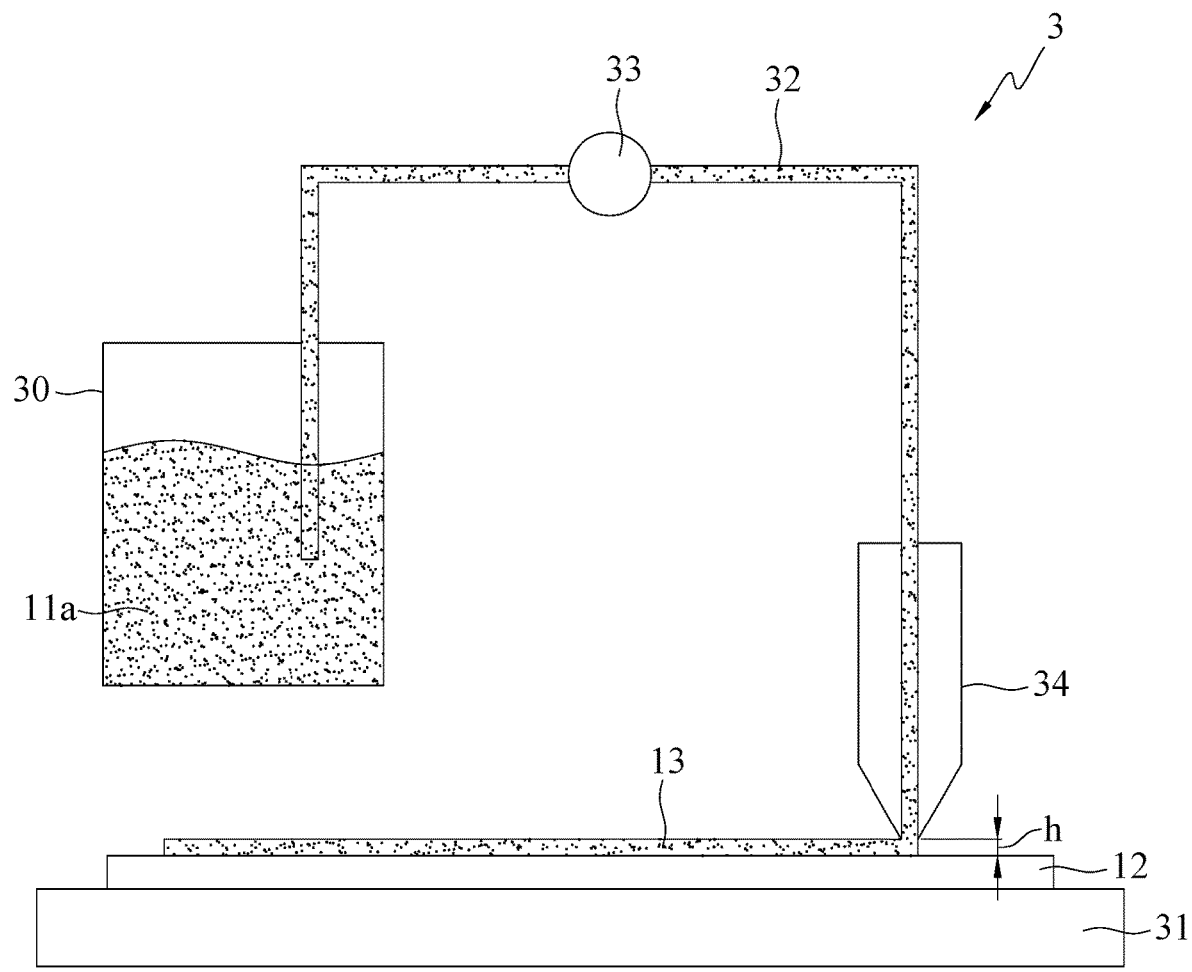
FIGS. 3A to 3B are schematic views illustrating a manufacturing method of a colored solar module according to the second embodiment of the present disclosure.
Figure 3B:
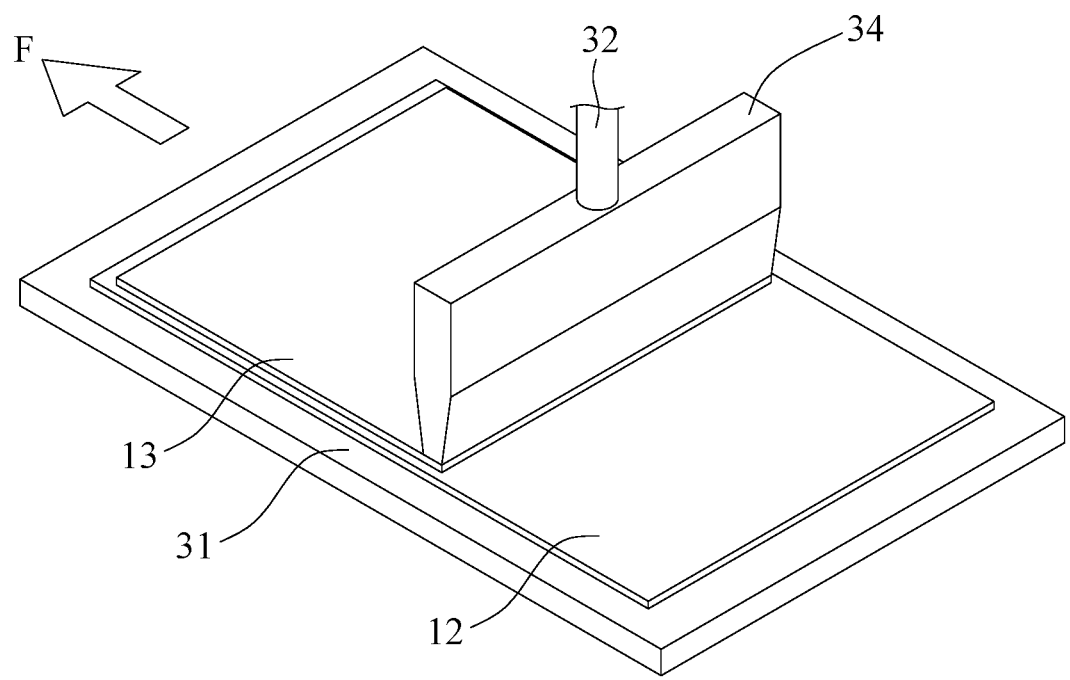

FIGS. 3A to 3B are schematic views illustrating the manufacturing method of the colored solar module 1 according to the second embodiment of the present disclosure. The difference between this embodiment and the first embodiment lies in the use of different mixed liquids, so the same features will not be repeated in the following.

First, mix the quartz powder that is previously mixed with impurities with polar DEF (N,N-diethylformamide, $C_5H_{11}NO$) solvent to form the coating material 11a in a solution state, and control the weight percentage the quartz content in the solution to be equal to or lesser than 40%, and then put the solution of the coating material 11a into the storage tank 30.

Next, as shown in FIG. 3A, after the coating material 11a is evenly mixed, the coating material 11a is fed into the slit coater 3 by the liquid supply pump 33, and the transparent plate 12 is placed on a moving stage 31 whose speed can be controlled by a program. The slit nozzle 34 of the coater 3 is close to the surface of the transparent plate 12 and the distance is about 10 microns to tens of microns (when the nozzle does not touch the glass). Through the relative movement between the slit nozzle 34 and the moving stage 31, the coating material 11a is ejected from the slit nozzle 34 via the pipe 32 to be evenly coated on the transparent plate 12. Afterwards, the coating material 11a is baked and cooled to form the coating layer 14.

In an embodiment, the thickness of the surface fluid 13, i.e., the thickness t of the coating layer 14 (as shown in FIG. 1A-1) is controlled or adjusted via the distance h and the relative moving speed (the moving direction F of the moving stage 31 shown in FIG. 3B) between the slit nozzle 34 and the transparent plate 12. Therefore, the greater the distance h and/or the slower the relative moving speed, the thicker the thickness t of the coating layer 14, and vice versa.

Therefore, the manufacturing method of this embodiment is suitable for the specifications of the colored solar module 1 with single color or large size, which can not only perform rapid large-area coating operations but also reduce the waste of the coating material 11a, so as to achieve the purpose of reducing production cost. In contrast, the manufacturing method of the first embodiment uses ethanol as a solvent, which is coated by a high-pressure nozzle, which is likely to cause waste due to spraying the coating material 11 out of the transparent plate 12.

In summary, the colored solar module 1 of the present disclosure mainly achieves the following technical effects via the design of the coating layer 14.

Firstly, an optical interference coating layer 14 containing quartz is formed on the inner side of the transparent plate 12, so as to form an optical interference effect by controlling the thickness t of the coating layer 14, and reflect the corresponding color light to the external environment of the colored solar module 1, thereby achieving the coloring effect. Moreover, since the colored solar module 1 only reflects a part of the color light during coloring, and the rest of the light can still pass through the coating layer 14, the colored solar module 1 can maintain high photoelectric conversion efficiency.

Secondly, by adjusting the thickness t and/or the refractive index of the single coating layer 14, multiple colors can be produced on the single transparent plate 12, and patterns can also be made at the same time as the coating layer 14 is formed, so that the aesthetic properties are not limited and the aesthetics can be improved.

Thirdly, the coating layer 14 of the colored solar module 1 of the present disclosure can be formed through only the ultrasonic high-pressure equipment 2 or the slit coater 3 placed in the atmospheric environment, without the use of large vacuum equipment such as vacuum sputtering machine, so the purpose of reducing production cost can be achieved.

While some of the embodiments of the present disclosure have been described in detail above, it is, however, possible for those of ordinary skill in the art to make various modifications and changes to the embodiments shown without substantially departing from the teaching and advantages of the present disclosure. Such modifications and changes are encompassed in the spirit and scope of the present disclosure as set forth in the appended claims.

What is claimed is:

1. A colored solar module, comprising:
an encapsulation layer having a first surface and a second surface opposite to each other;
at least one solar cell embedded in the encapsulation layer; and
a transparent plate having a single coating layer containing quartz, wherein the transparent plate is attached onto the first surface of the encapsulation layer via the coating layer, and wherein the coating layer further contains an impurity that is composed of one or more of oxides, carbonates, borates and silicates of elements of an alkali family, an alkaline earth group and a boron group.

2. The colored solar module according to claim 1, wherein the coating layer has a thickness of 0.1 microns to 50 microns.

3. The colored solar module according to claim 1, wherein the transparent plate has a refractive index greater than a refractive index of the encapsulation layer formed between the transparent plate and the at least one solar cell.

4. The colored solar module according to claim 1, wherein the coating layer is a structure with a single uniform thickness or a structure with different regional thicknesses.

5. The colored solar module according to claim 1, wherein the at least one solar cell is a crystalline silicon solar cell or a thin-film solar cell.

6. The colored solar module according to claim 1, further comprising a cover plate disposed on the second surface of the encapsulation layer.

7. The colored solar module according to claim 1, wherein the coating layer is intrinsically colorless and transparent.

* * * * *